United States Patent [19]

Sugino et al.

[11] 4,377,865

[45] Mar. 22, 1983

[54] SEMICONDUCTOR LASER

[75] Inventors: Takashi Sugino; Masaru Wada, both of Takatsuki; Hirokazu Shimizu, Toyonaka; Kunio Itoh, Uji, all of Japan

[73] Assignee: Matsushita Electric Industrial Co., Ltd., Kadoma, Japan

[21] Appl. No.: 218,442

[22] Filed: Dec. 19, 1980

[30] Foreign Application Priority Data

Dec. 20, 1979 [JP] Japan .................................. 54-166523
Feb. 19, 1980 [JP] Japan .................................. 55-20277

[51] Int. Cl.$^3$ ................................................ H01S 3/19
[52] U.S. Cl. .................................... 372/45; 357/17; 372/46; 372/50
[58] Field of Search .................. 331/94.5 H; 372/45, 372/46, 50; 357/17

[56] References Cited

U.S. PATENT DOCUMENTS 4,215,319  7/1980  Botez .............................. 331/94.5 H
4,217,561  8/1980  Scifres et al. ................... 331/94.5 H
4,280,858  7/1981  Opdorp et al. ............ 331/94.5 H X
4,287,485  9/1981  Hsieh .............................. 331/94.5 H Primary Examiner—James W. Davie
Attorney, Agent, or Firm—Cushman, Darby & Cushman

[57] ABSTRACT

On an n-type semiconductor substrate having a ridge part of stripe-shaped pattern, the following layers are formed by liquid phase sequential epitaxial growth: an undoped active layer; a p-type clad layer; and an n-type isolation layer. Thereafter, a Cd impurity is diffused in the isolation layer in a stripe-shaped pattern at the position above the ridge part, thereby forming a p+-type conduction region in the central part of the isolation layer. By forming the stripe-shaped ridge part on the substrate overriding the active layer, the injected current is effectively confined to the lasing region which is the thinner part of the active layer and is on the ridge part. Therefore the threshold current is decreased. Accordingly, the light lased in the active layer is effectively confined in a stripe-shaped lasing region thereof, and a stable transverse mode of lasing is obtainable.

11 Claims, 9 Drawing Figures

SEMICONDUCTOR LASER

BACKGROUND OF THE INVENTION

1. Field of the Invention:

The present invention relates to an improvement in a semiconductor laser. The improvement is for obtaining lasers with a low threshold current and stable transverse mode lasing.

2. Description of the Prior Art:

Semiconductor lasers have many advantages such as smallness, high efficiency, direct modulation by its driving current, and etc., and therefore have bright future as light sources for optical communication and optical data processing. Laser for such use necessitates characteristics of stable fundamental transverse mode lasing, low threshold current, high output of light and high reliability.

One example of the conventional semiconductor laser of GaAs/GaAlAs double heterostructure planar type is shown in FIG. 1, which is a sectional elevation view by a plane perpendicular to output light thereof. The conventional laser of FIG. 1 is made by sequential liquid phase epitaxial growth wherein on a substrate 1 of . . . n-GaAs, which has on its face selectively diffused regions, 2,2 of . . . p-GaAs (formed by Zn-diffusion), the following layers are sequentially formed:

a first clad layer 3 of . . . n-Ga$_{1-x}$Al$_x$As,
an active layer 4 of . . . (non-doped) GaAs,
a second clad layer 5 of . . . p-Ga$_{1-x}$Al$_x$As, and
a cap layer 6 of . . . p-GaAs.

Then, on the cap layer 6, an insulation film 7 having a stripe-shaped opening is formed by a photolithographic method. Thereafter a p-side ohmic electrode 8 and an n-side ohmic electrode 9 are formed on the exposed stripe-shaped face of the cap layer 6 and on the bottom face of the substrate 1, respectively.

In the abovementioned type semiconductor laser of FIG. 1, the injected current is effectively confined in a narrow stripe-shaped lasing region by means of the selectively diffused p-type regions 2,2, and also by means of the stripe-pattern p-side ohmic electrode 8. As a result of the narrow confinement of the injected current, its fundamental transverse mode of oscillation becomes stable. However, the structure of FIG. 1 has a problem of using a diffusion step on the substrate 1, and therefore the crystal structure of substrate surface is damaged, and hence the subsequently grown crystal receives undesirable effect therefrom, resulting in short lifetime of the device.

SUMMARY OF THE INVENTION

The present invention purposes to provide a semiconductor laser which has a smaller threshold current, stable fundamental transverse mode lasing, and reliable performance for a long lifetime.

DESCRIPTION OF PREFERRED EMBODIMENTS

A semiconductor laser in accordance with the present invention comprises:

a semiconductor substrate having a ridge part or higher part of a stripe-shaped pattern on a principal face thereof, and lower face parts on both part of the ridge part, an active layer of a smaller energy gap and a larger refractive index than those of said substrate, said active layer being substrate and having a thinner part on said ridge part and thicker parts on said lower parts, and a stripe-shaped electrode formed above said higher face part.

Figure 2A:
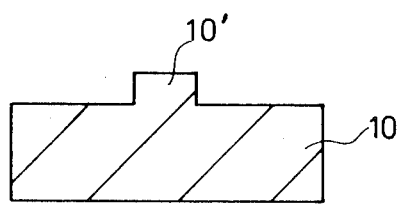
FIG. 2(a) to FIG. 2(c) are sectional elevation views showing a flow of manufacturing steps of an example embodying the present invention.

Hereafter the invention is elucidated referring to the accompanying drawings, FIG. 2(a) and thereafter, which show preferred embodiment of the present invention.

Figure 2B:
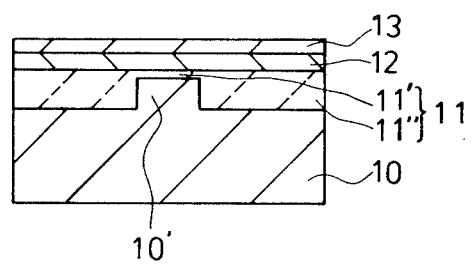
Figure 2C:
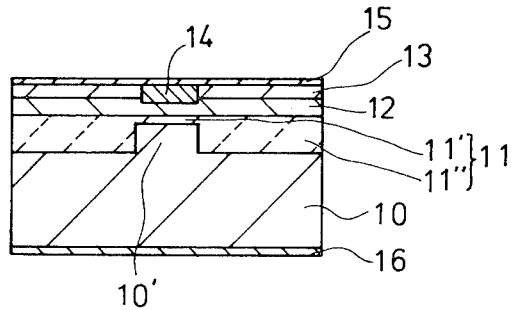

FIGS. 2(a) to 2(c) show flow of manufacturing steps of an example of InGaAsP/InP type double heterostructure laser.

A completed laser of FIG. 2(c) is manufactured as follows:

An n-type substrate 10 of n-type InP with a ridge part or a higher part 10' of a stripe-shaped pattern as shown by FIG. 2(a) is used as a starting substrate. Then, on the face of The substrate 10 1 of . . . n-type InP
(S-doped, about $1\times10^{18}$ cm$^{-3}$ concentration), the following epitaxial layers are formed by sequential liquid phase epitaxial growth method:

an active layer 11 of . . . undoped In$_{0.28}$Ga$_{0.72}$As$_{0.62}$P$_{0.38}$
(about 0.1 μm thick on the higher part 10'), a clad layer 12 of . . . p-type InP
(about 2 μm thick, Zn-doped, about $5\times10^{17}$ cm$^{-3}$ concentration), and a current limiting layer 13 of . . . n-type In$_{0.28}$Ga$_{0.72}$As$_{0.62}$P$_{0.38}$
(about 1.5 μm thick, Te-doped, about $1\times10^{17}$ cm$^{-3}$ concentration).

Then a wafer shown by FIG. 2(b) is made.

The active layer 11 is formed to have smaller energy gap and larger refractive index than those of the substrate 10. In general, in the epitaxial growth, the growth rate is slower at a protruding part, accordingly the active layer 11 grows slower on the higher part 10' of the substrate than on the lower part. Accordingly, the upper face of the active layer 11 becomes substantially flat thereby forming a thinner part 11' of stripe-shaped pattern at the center which works as a lasing part and a thicker part 11" disposed on both sides of said thinner part 11'.

Then Cd as an acceptor is selectively diffused into the current limiting layer 13 so as to penetrate it and reach the clad layer 12, with a stripe-shaped pattern above the higher part 11', thereby a p$^+$-type current injecting region 14 is formed ohmicly contacting the p-type clad layer 12.

A p-side ohmic electrode 15 and n-side ohmic electrode 16 are formed on the p$^+$-type current injecting region 14 and the current limiting layer 13 and on the bottom face of the substrate 10, respectively, as shown by FIG. 2(c), thus the laser is completed.

By means of the structure as abovementioned and shown by FIG. 2(c), a p-n junction is formed between the clad layer 12 and the current limiting layer 13, except the part of the Zn-doped current injecting region 14. Therefore, the current is injected to the active layer only through the region 14.

Since the resistivity of the active layer 11 is selected to be higher than that of the substrate 10, the major part of the current injected into the active layer 11 passes only through the thinner part 11' of the active layer 11. Therefore, the injected current is sufficiently confined to the narrow stripe-shaped active region 11'. Furthermore, since the thinner part 11' has a higher volume density of the injected current, the lasing is substantially confined in the thinner part 11', and therefore, by making the width of the thinner part 11' small, a stable fundamental transverse mode lasing is obtainable in the thinner part.

According to the improved constitution of this example, the substrate 10 serves as a lower current limiting layer and also as a clad layer, and such feature is realized by a double heterostructure with an active layer of smaller energy gap and larger refractive index than those of the substrate. This configuration has an advantage that a clad layer (corresponding to the layer 3 of FIG. 1) can be omitted, leading in simple manufacturing.

More details of manufacturing of the example of FIG. 2(a) to FIG. 2(c) are as follows:

The ridge part or higher part 10' is formed by selectively removing the surface part of the substrate 10 by a known chemical etching. The height and width of the higher part 10' is, for example 1 $\mu$m and 5 $\mu$m, respectively. Then, on the substrate 10 with the ridge shape higher part 10' the abovementioned layers are formed by known liquid phase sequential epitaxial growth. In the epitaxial growth the active layer 11 is formed so as to form its upper face substantially flat. The growth starts from 650° C. and at the cooling rate of 0.5° C./minute.

The Cd-diffusion to form the current injection region 14 is made by forming $Si_3N_4$ film (not shown) on the epitaxially grown wafer shown by FIG. 2(b), and making a stripe-shaped opening of 5 $\mu$m width at the part above the higher part 10', and diffusing Cd through this opening using the $Si_3N_4$ film as a mask. The depth of the diffusion is to penetrate the current limiting layer and slightly to come into the clad layer 12, that is 2 to 2.5 $\mu$m deep. Then, after removing the $Si_3N_4$ mask, Au-Zn vapor deposition is made on the upper face and alloying treatment is made to form the p-side ohmic electrode 15. The n-side electrode 16 is made by vapor depositing AuSn followed by alloying treatment.

The laser of the first example manufactured in the line of the abovementioned elucidation has sufficiently narrow path of the injected current, and the threshold current is almost halved in comparison with the conventional stripe-shaped laser, and also a stable transverse mode lasing is obtainable, and furthermore, its manufacture is easy and lifetime is long since the epitaxial growth is started from a substrate which has no strain caused by a diffusion process.

A modified example of the laser, which has the similar sectional view configuration as of FIG. 2(c) but has other epitaxial layer has the similar satisfactory performance, when its active layer is of a direct semiconductor having a smaller energy gap and larger refractive index than those of the substrate, and lattice constant is close to that of the substrate, for example, a laser of InP-InGaAsSb is possible.

Figure 1:
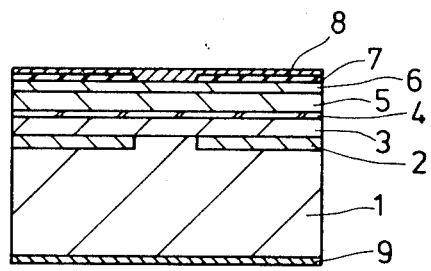
FIG. 1 is a sectional elevation view of one example of the conventional semiconductor laser of double heterostructure planar type.

As another modification, instead of forming the selectively diffused current injection region 14 a use of stripe electrode like the one shown by FIG. 1 is also possible.

FIG. 3(a) to FIG. 3(e) show manufacturing flow of another example of the laser in accordance with the present invention, wherein the laser light can be taken out from a plural number of light wave-guide, by forming light wave-guide parallelly on both sides of the laser cavity, that is, by utilizing the grooves on both side of the higher part as the light wave-guide.

Figure 3:
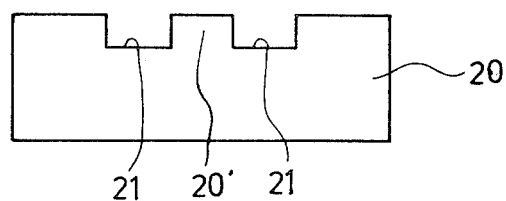
FIG. 3(a) to FIG. 3(e) are sectional elevational views showing a flow of manufacturing steps of another example embodying the present invention.
Figure 3:
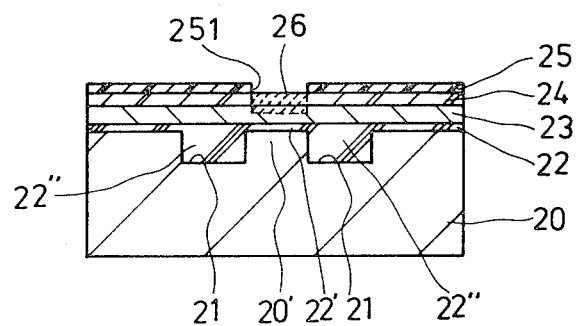
Figure 3C:
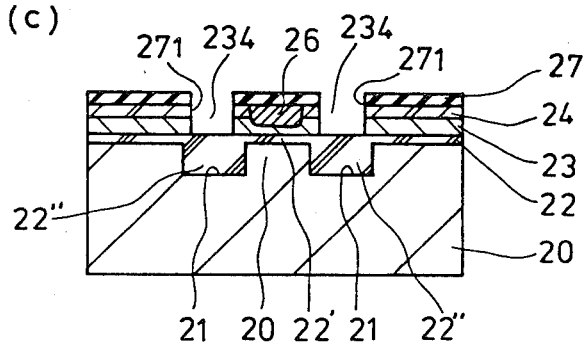
Figure 3D:
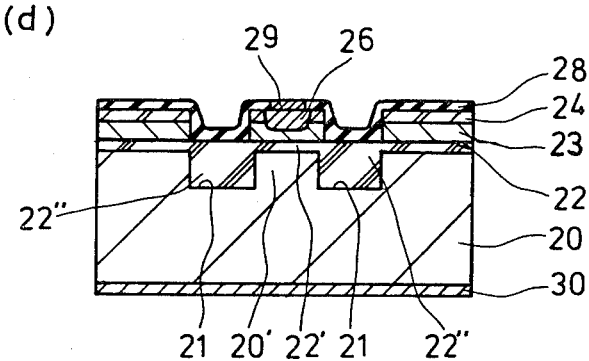
Figure 3E:
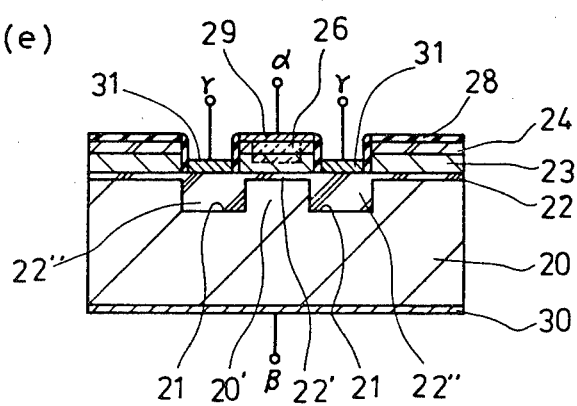

The manufacturing of the laser of FIG. 3(e) is as follows:

As a starting substrate, an n-type InP substrate 20 with a two parallel grooves 21,21, which define a ridge part or higher part 20' therebetween as shown by FIG. 3(a), is used. Then on the face of the substrate 20 of . . . n-type InP
(S-doped, about $1 \times 10^{18}$ cm concentration), the following epitaxial layers are formed by sequential liquid phase epitaxial growth method:

an active layer 22 of . . . undoped $In_{0.28}Ga_{0.72}As_{0.62}P_{0.38}$
(about 0.2 $\mu$m thick on the higher part 20'), a clad layer 23 of . . . p-type InP
(about 2 $\mu$m thick, Zn-doped, about $5 \times 10^{17}$ cm$^{-3}$ concentration) and a current limiting layer 24 of . . . n-typed $In_{0.28}Ga_{0.72}As_{0.62}P_{0.38}$
(about 1.5 $\mu$m thick, Te-doped, about $1 \times 10^{17}$ cm$^{-3}$ concentration).

The active layer 22 is formed to have a higher resistivity, smaller energy gap and larger refractive index than those of the substrate 20. In general in the epitaxial growth, the growth rate is slower at a protruding part, accordingly, the active layer 22 grows slower on the higher part 20' of the substrate than on the lower part. Accordingly, the upper face of the active layer 22 becomes substantially flat thereby forming a thinner part 22' and thicker parts 22" disposed on both sides of said thinner part 22'. The thinner part later forms a lasing region and the thicker parts light wave-guides, when the laser is completed. Then insulation film ($Si_3N_4$) 25 is formed as shown by FIG. 3(b) and a stripe-shaped opening 251 is made by known photolithographic method at the part above the higher part 20'. Then Cd as an acceptor is selectively diffused by utilizing the insulation film 25 as a mask into the current limiting layer 24 so as to penetrate it and reach the clad layer 23, thereby forming a p$^+$-type diffused region 26 to serve as a current injection region 26 as shown by FIG. 3(b). Thereafter, the insulation film 25 is removed and a second insulation film ($Si_3N_4$) 27 is formed on the wafer, and stripe-shaped openings 271,271 are made at the parts above the grooves 21,21, and by utilizing the second insulation film 27 as an etching mask, the layers 24 and 23 are etched and removed at the parts above the grooves to form openings 234,234 thereby exposing the active layers 22, as shown by FIG. 3(c). Then, after removing the second insulation film 27, a third insulation film ($SiO_2$) 28 is formed all the face of the wafer, and an opening is formed on the part above the p$^+$-type current injection region 26 to expose it, and a p-side ohmic electrode 29 is formed by a known method, and an n-side electrode 30 is also formed by a known method as shown by FIG. 3(d). Thereafter, by selectively removing the third insulation film 28 at the part above the grooves 21,21, thereby exposing the surface of the active layer there, electrodes 31,31 to produce Schottky junction is formed on the active layer at both sides of the ridge part or higher part 20' as shown by FIG. 3(e).

When a forward voltage, that is a positive potential to the p-side terminal α against the n-side terminal β, is impressed on the device, the device performs a lasing in the active region 22' which is the active layer 22 at the part on the higher part 20'. The lased light is likely to diffuse sideway, since there is no particular light confining measure such as varying refractive index at the side ends of the active region 22'. The groove 21 is filled with the same semiconductor substance 22" as that of active region 22', and hence the groove part forms a light wave-guide. Therefore, the laser light diffused from the active region 22' into the light wave-guides 22" is also confined here. And that, the light propagating in the active region 22' and the light propagating in the wave-guides are lights having the same wavelength, which are emitted from the same single laser chip. Therefore, the laser of the example of FIG. 3(e) can emit three parallel laser lights of the same wavelength in the direction perpendicular to the paper in the case of FIG. 3(e), one from the active region 22', and other two from the light wave-guide 22",22". The light of the active regions 22' and the lights of the wave-guides are propagating, coupling each other, and emit the laser beam from the end faces.

Furthermore, by application of voltage between the terminals β and γ in this laser, propagation constant of the light wave-guide varies, and coupling state with the light propagating in the active region can be changed. Therefore, only by changing the voltage between the terminals β and γ, the ratio of intensities of light emitted from the active region 22' and the light wave-guide 22" can be controlled. This is elucidated hereinafter.

The electrode 31 and the light wave-guide region 22" form a rectifying contact made by Schottky junction, and by this contact a depletion layer is formed in the region 22". The active layer 22 is ordinarily undoped, and hence has a high resistivity, and is likely to allow expansion of the depletion layer. The depletion layer has a higher refractive index than the surrounding parts, and by controlling the depletion layer the state of coupling between the active region 22' and the light wave-guide region 22" can be varied. Therefore, by changing an inverse bias voltage to be impressed on the terminal of the electrode 31 forming the Schottky junction, expansion of the depletion layer in the light wave-guide 22' can be changed, and thereby changing the rate of emission of light from the light wave-guide 22'. That is to say, by the change of the depletion layer by an impression of voltage to the terminal γ, the optical coupling of the active region 22' and the light wave-guide region 22" changes, and rate of light diffusing from the active region 22' to the light wave-guide 22" can be changed.

In the abovementioned example, the electrode 31 has been of Schottky junction, but other modifications can be made such that, in order to form a depletion layer in the light wave-guide 22" and it, for example a MOS structure putting an insulation film inbetween, or a p-n junction can be adopted. Furthermore, the grooves 21 may be formed, not only on both sides of the ridge part or higher part 20', but also on one side only of the ridge part, in which case two laser beams are emitted.

The structure of the laser of FIG. 3(e) can be realized by adopting such substance for the substrate 20 that has a larger energy gap and smaller refractive index than those of the active layer 22 and forming the ridge part and the groove part. A plural number of fundamental transverse mode laser lights are obtainable by this laser, and the light intensity ratio between the light lased in the active region and the light of the light wave-guide can be controlled only by changing of voltage to the electrode 31.

Details of the manufacturing of the laser of FIG. 3(a) to FIG. 3(e) are elucidated hereafter. On an n-type InP substrate 20, a pair of parallel grooves 21,21 are formed by chemical etching. Each groove is 1 μm deep and 4 μm wide, and pitch of the two grooves is 5 μm. The epitaxial growth of the active layer 22 is controlled so as to fill the grooves 21,21. The sequential liquid phase epitaxial growth is started from 650° C. at the cooling rate of 0.5° C./min. The width of the stripe-shaped opening 251 of the first insulation film mask is 5 μm wide. The diffusion of the Cd as acceptor to form the current injection region 26 is made to a depth of 2–2.5 μm from the face of the current limiting layer 24. The p-side electrode 29 is formed by vapor deposition of Au-Zn alloy followed by alloying treatment (annealing). The n-side electrode 30 is formed by sequential vapor deposition of Au-Sn alloy followed by alloying treatment. The Schottky electrodes 31,31 formed on the light wave-guides 22",22" are formed by vapor deposition of Au.

A modified device can be made similarly by adopting InP-InGaAsSb or GaAs-GaAlAs double heterostructure.

What is claimed is:
1. In a semiconductor laser,
    a semiconductor substrate having a stripe-shaped ridge part on a principal face thereof and lower parts on both sides of said ridge part,
    an active layer formed directly on said substrate and having a smaller energy gap and a larger refractive index than those of said substrate, said active layer having a thinner part on said ridge part and thicker parts on said lower parts, and
    a stripe-shaped electrode formed above said ridge part.
2. In a semiconductor laser, a structure comprising
    a semiconductor substrate having a stripe-shaped ridge part on a principal face thereof and lower parts on both sides of said ridge part,
    an active layer formed directly on said substrate and having a smaller energy gap and a larger refractive index than those of said substrate, said active layer having a thinner part on said ridge part and thicker parts on said lower parts, and
    a stripe-shaped electrode formed above said ridge part,
    the surface of said thinner part of said active layer being flush with those of said thicker parts on said lower parts.
3. A structure in a semiconductor laser in accordance with claim 1 or 2, wherein said lower parts are chemically etched parts, and
    said active layer has a substantially flat face.
4. A structure in a semiconductor laser in accordance with claim 1 or 2 which further comprises a current limiting layer having the same conductivity type as that of said substrate, and a current injection region which is selectively formed in said current limiting layer above said ridge part and has the opposite conductivity type to that of said substrate.

5. A structure in a semiconductor laser in accordance with claim 1 or 2 which further comprises a clad layer having a conductivity type opposite to that of said substrate and disposed on said active layer.

6. A structure in a semiconductor laser in accordance with claim 1 or 2, wherein said substrate is InP, and said active layer is InGaAsP.

7. A structure in a semiconductor laser in accordance with claim 4, wherein said current injection region is a Cd-diffused region.

8. A structure in a semiconductor laser in accordance with claim 1 or 2, wherein said substrate has grooves neighboring to said ridge part.

9. A structure in a semiconductor laser in accordance with claim 8, wherein said active layer on said grooves forms a light wave-guide.

10. A structure in a semiconductor laser in accordance with claim 9, which further comprises a depletion layer in said light wave-guide.

11. A structure in a semiconductor laser in accordance with claim 10 which further comprises a Schottky electrode disposed on said light wave-guide for application of voltage for controlling a thickness of said depletion layer.

* * * * *

UNITED STATES PATENT AND TRADEMARK OFFICE
CERTIFICATE OF CORRECTION

PATENT NO.  : 4,377,865
DATED       : March 22, 1983
INVENTOR(S) : Takashi SUGINO, Masaru WADA, Hirokazu SHIMIZU &
              Kunio ITOH It is certified that error appears in the above-identified patent and that said Letters Patent is hereby corrected as shown below:

On the title page re Priority Data [30]

Second line replace: "Feb. 19, 1980  [JP]  Japan...55-20277 by    --Feb. 19, 1980  [JP]  Japan...52-20257--

Signed and Sealed this

Third Day of January 1984

[SEAL]

Attest:

GERALD J. MOSSINGHOFF

Attesting Officer

Commissioner of Patents and Trademarks